United States Patent [19]

Stickler

[11] Patent Number: 6,025,708
[45] Date of Patent: Feb. 15, 2000

[54] SYSTEM FOR VERIFYING SIGNAL VOLTAGE LEVEL ACCURACY ON A DIGITAL TESTING DEVICE

[75] Inventor: Heather L. Stickler, Ft. Collins, Colo.

[73] Assignee: Hewlett Packard Company, Palo Alto, Calif.

[21] Appl. No.: 08/979,511

[22] Filed: Nov. 26, 1997

[51] Int. Cl.[7] ............................ G01R 31/00; G01R 31/28
[52] U.S. Cl. ........................ 324/158.1; 324/73.1
[58] Field of Search ................. 324/158.1, 537, 324/73.1, 74, 130; 702/85, 107; 714/724

[56] References Cited

U.S. PATENT DOCUMENTS

| | | | |
|---|---|---|---|
| 3,665,504 | 5/1972 | Silverman | 324/158.1 |
| 5,212,443 | 5/1993 | West et al. | 324/158 R |
| 5,225,772 | 7/1993 | Cheung et al. | 324/158 R |
| 5,256,964 | 10/1993 | Ahmed et al. | 714/724 |
| 5,262,716 | 11/1993 | Gregory, Jr. et al. | 324/73.1 |
| 5,390,194 | 2/1995 | Mannle | 371/27 |
| 5,471,145 | 11/1995 | Mydill | 324/601 |
| 5,485,096 | 1/1996 | Aksu | 324/761 |
| 5,504,432 | 4/1996 | Chandler et al. | 324/537 |
| 5,590,136 | 12/1996 | Firooz | 371/25.1 |
| 5,633,596 | 5/1997 | Ilani | 324/754 |

*Primary Examiner*—Ernest Karlsen

[57] ABSTRACT

The present invention is generally directed to a system and method for testing component tolerances of a device for testing integrated circuits, the device having a plurality of test connectors disposed at a test head, each test connector having electrical conductors carrying electrical signals for a test channel, wherein each test channel corresponds to a circuit board that includes at least one driver and one receiver. In accordance with the broad concepts and teachings of the invention, an apparatus and method operate to compare driver and receiver components by interconnecting drivers from a first board to receivers of a second board, and vice-versa. In accordance with one aspect of the present invention, a method is provided for diagnosing component variances in a testing device, wherein the testing device preferably has a plurality of test connectors disposed at a test head, each test connector having electrical conductors carrying electrical signals for a test channel, wherein each test channel corresponds to a circuit board that includes at least one driver and one receiver. The method includes the step of establishing an electrical connection between electrical conductors of a first and second test connector such that a first driver from a first circuit board is electrically connected across a low impedance path to a first receiver or PMU on a second circuit. The method then controls the output of the first driver to drive an electrical signal to a predetermined value, and evaluates the signal level received at the PMU on the second circuit board. Finally, the method controls the output of the first driver to drive an electrical signal to a predetermined value across a low impedance path to the first receiver and verifies that, considering predetermined error of the first driver, the voltage level interpreted by the first receiver is within published ATE specifications. If so, then the system recognizes the tested components as being within specified tolerances. It not, the system flags the error and may take further appropriate, corrective action. Such corrective action may comprise initiating further testing or notifying (via email or otherwise) relevant test personnel to conduct further manual testing.

20 Claims, 9 Drawing Sheets

6,025,708

SYSTEM FOR VERIFYING SIGNAL VOLTAGE LEVEL ACCURACY ON A DIGITAL TESTING DEVICE

BACKGROUND OF THE INVENTION

1. Field of the Invention

The present invention generally relates to system for testing automatic testing machines, and more particularly to method and apparatus for testing the accuracy of signal voltage levels on a digital testing device.

2. Discussion of the Related Art

A variety of automatic test equipment (ATE) have long been known for testing electronic circuits, devices, and other semiconductor and electronic products. Generally, automatic test equipment are divided into two broad categories, analog testers and digital testers. As the names imply, analog testers are generally designed for testing analog circuit devices, while digital testers are designed for testing digital circuit devices. Digital testers, as is known, generally include a testing device having a number of internal circuit cards or channels that generate programmably controlled test signals for testing and evaluating a Device Under Test (DUT). More specifically, ATE are programmably controlled to be adapted or configured to testing a variety of devices in a variety of ways. This is achieved by programming output signals to inject a certain signal (or signal transition) to a certain pin or signal line on a DUT. In this regard, a digital tester generally includes a test head whereby electrical signals are input to and output from the tester. The test head comprises a number of connectors, each defining a channel, which may be connected via cable or otherwise to a device under test. The electronics within the digital tester may then input and output signals to/from a DUT via the test head.

By way of an extremely simple illustration, consider a digital tester that is configured to test a wafer containing, among other things, a two input AND gate. The digital tester may be configured to apply a logic one on the two signal lines that correspond to the inputs of the AND gate, then receive the signal on the signal line corresponding to the output to ensure that it is driven to a logic one. The tester may then be configured to alternatively apply logic zero signals on each of the two signal lines corresponding to the AND gate inputs, in order to verify that the output of the AND gate transitions from a logic one to a logic zero in response. Although such a test will verify the functional operation of the AND gate, additional tests must be executed to verify timing and other aspects of the AND gate.

For example, assume that the two input signals to the AND gate are a logic one and a logic zero, the output is also a logic zero. When, however, the second input transitions from a logic zero to a logic one (whereby both inputs are at a logic one) then the output of the AND gate transitions from a logic zero to a logic one. It is important, however, that the output fully transition to a high state. More specifically, and as is known, digital logic devices operate, generally, in a range of zero to five volts, where zero volts is a logic zero and five volts is a logic one. As devices become loaded, however, they often fail to fully drive an output signal to five volts. Accordingly, a range is presumed to be a logic one. For example, any output above 2.4 volts (depending upon device specifications) may be treated as a logic one. Thus, continuing with the AND gate example, when both inputs are above 2.4 volts, the output level should also drive to at least 2.4 volts. Suppose an automatic tester incorrectly interpreted a 2.3 volt output voltage as 2.4 volts. The tested component may be deemed as good, when in fact it was out of tolerance with the manufacturer's specifications. It will be appreciated that the example given above is an extremely simple example and is presented merely for purposes of illustration, and, as will be appreciated by those skilled in the art, digital testers are much more sophisticated and are capable of performing much more sophisticated and complex testing routines.

Accordingly, an extremely important aspect of ATE, including digital testers, is that the testing equipment maintain extremely accurate tolerances. Otherwise, it will not be clear whether measured values of a DUT reflect errors or discrepancies within the DUT, or whether errors or discrepancies result from component or other tolerance variations in the ATE components. In this regard, automatic test equipment manufacturers generally provide a set of built-in-test (BIT) routines for the automatic test equipment. However, and as will be further described below, these manufacturer provided BIT routines have proven to be generally inadequate in today's market of high-speed components and high volume manufacturing facilities.

A digital tester generally comprises a number of similar (if not identical) channels, each comprising a number of drivers and receivers for driving output signals or receiving input signals (output from the tester or input to the tester). These channels (which are generally comprised on a single circuit board) often include a Parametric Measuring Unit (PMU) or some other type of measuring device for sensing and measuring the magnitude of a signal. As is known, PMUs are known for calibrating on-board components. Thus, when a given driver is programmed to generate a signal of a certain amplitude, the on-board PMU may monitor and measure that signal in order to determine whether the amplitude of that signal is the proper value.

This type of further testing may be accomplished by using accurate, external testing equipment in a manual fashion. For example, voltmeters may be used for testing voltage levels, and oscilloscopes may be used for evaluating timing aspects. However, it will be appreciated that external testing of an ATE is extremely time consuming, and therefore adversely impacts production quantities. A particular problem that has been noted in recent years specifically relates to a digital tester's ability to self-test for accuracy. As a result of the general failure of testing devices in this respect, circuit designers have been known to design tests for specific testers. That is, a circuit designer may design a test having test parameters such that the test will pass the testing requirements of a given automatic testing device, while failing those same tests on other testers. Charts have been generated that keep track of certain characteristics of various automatic testing equipment. Circuit designers have used the information contained within these charts in order to design test parameters to pass the test of a given tester. Clearly, however, this approach adversely affects the overall yield of a designed product, as well as material flow through the high volume manufacturing environment, and is disfavored.

Accordingly, there is a need to develop a system for improving the accuracy of automatic testing equipment, specifically digital testers, by verifying with a high degree of accuracy the performance of the digital testers.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to a system and method for testing component tolerances of a device for testing integrated circuits, the device having a plurality of test connectors disposed at a test head, each test connector having electrical conductors carrying electrical signals for a test channel, wherein each test channel corresponds to a circuit board that includes at least one driver and one receiver. In accordance with the broad concepts and teachings of the invention, an apparatus and method operate to compare driver and receiver components by interconnecting drivers from a first board to receivers of a second board, and vice-versa. Since built in test procedures provided by the tester manufacturer typically calibrate the drivers and receivers of a single board with a measurement unit provided on that same board, it is possible for the drivers and receivers of that board to become out of specification without detection, if that board's measurement unit goes out of specification. Accordingly, the cross-check provided by the present invention provides an much improved system and method for verifying the accuracy of the operation of tester components.

In accordance with one aspect of the invention an apparatus is provided that includes shorting means for establishing a low impedance electrical connection between electrical conductors of a first and second test connector, such that a first driver from a first circuit board is electrically connected across a low impedance path to a voltage measurement unit on a second circuit board. Preferably, this "shorting means" is implemented through a printed circuit board that contains metal traces that short, or establish a direct electrical connection, between pins of two test connectors. A controller is configured to control the first driver so that the first driver outputs an electrical signal of a predetermined, targeted value. In order to test whether this targeted value, however, is accurate, the measurement unit is disposed to receive and measure the signal voltage level received. A verifying means is configured to verify that the signal level received at the measurement unit is within a predetermined tolerance of the predetermined targeted signal level.

In accordance with another aspect of the invention an apparatus is provided that includes shorting means for establishing a low impedance electrical connection between electrical conductors of a first and second test connector, such that a first driver from a first circuit board is electrically connected across a low impedance path to a first receiver on a second circuit board. A controller is configured to control the first driver so that the first driver outputs an electrical signal of a predetermined value. It is assumed that this output value is accurate, since the first driver has been pre-tested (as described above) for accuracy. Therefore, this aspect of the testing evaluates receiver accuracy. Accordingly, an evaluating means is designed to evaluate the signal level received at the first receiver, and a verifying means is configured to verify that the signal level interpreted at the first receiver is within a predetermined tolerance of the redetermined signal level output from the first driver.

In accordance with another aspect of the present invention, a method is provided for diagnosing component variances in a testing device, wherein the testing device preferably has a plurality of test connectors disposed at a test head, each test connector having electrical conductors carrying electrical signals for a test channel, wherein each test channel corresponds to a circuit board that includes at least one driver and one receiver. The method includes the step of establishing an electrical connection between electrical conductors of a first and second test connector such that a first driver from a first circuit board is electrically connected across a low impedance path to a first receiver on a second circuit board, wherein the first driver is known to be within a specified tolerance. The method then controls the output of the first driver to drive an electrical signal to a predetermined value, and evaluates the signal level interpreted at the first receiver. Finally, the method verifies that the signal level interpreted by the first receiver is within a predetermined tolerance of the predetermined signal level output from the first driver. If so, then the system recognizes the tested components as being within specified tolerances. It not, the system flags the error and may take further appropriate, corrective action. Such corrective action may comprise initiating further testing or notifying (via email or otherwise) relevant test personnel to conduct further manual testing.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
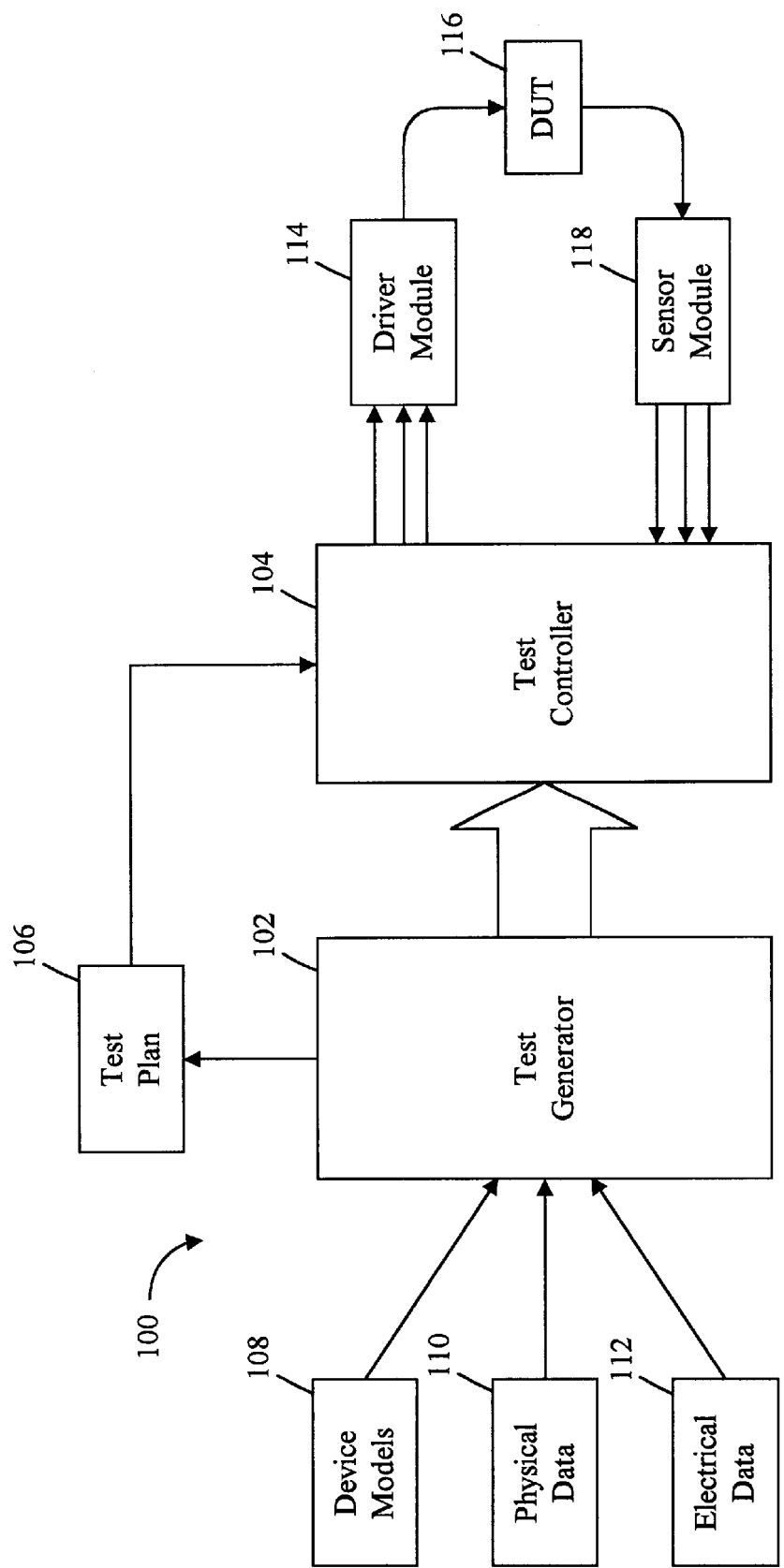
FIG. 1 is a block diagram of an automated testing device for testing digital electronic circuitry.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to FIG. 1, a block diagram of a "board-type" ATE system (tester) 100 is shown. Although the preferred embodiment of the present invention is directed to wafer testers, the concepts and teachings are not so narrowly limited. Accordingly, FIG. 1 is shown merely to illustrate a prior art platform to which the concepts and teachings of the present invention may be applied. ATE system 100 includes a test generator 102 and a test controller 104. Test generator 102 generates an in-circuit test for each device on a board to be tested. A generic test plan 106 provides supervisory control over testing. This includes sequencing the tests, logging the results, controlling board/fixture interfacing, controlling the test power supplies, and providing a user interface. The combination of the individual in-circuit tests and test plan 106 forms a test specification.

A device models library 108, physical database 110, and an electrical database 112 may provide the data required for test generator 102 to generate the in-circuit tests. Electrical database 112 may contain a list of the devices on the DUT board 116, an electrical description for each device, and electrical interconnect information. Physical database 110 may contain a topological description of the board which may be used by test controller 104 to locate and test DUT 116. Physical database 110 and electrical database 112 are typically generated by a CAD/CAM (Computer Aided Design/Computer Aided Manufacturing) system during design of a board.

Device models library 108 contains a plurality of pregenerated generic models for commonly used digital integrated circuit chips (ICs). Essentially, each model is a test routine which is to be inserted (i.e., edited) into the board test specification. Each device model may provide, for a specific device, pin-out information (i.e., which pins are inputs, outputs, bi-directional, or unused), a test program, a method for pre-conditioning (described below) each output of the device, and device specific information including a test pattern rate and required signal levels.

Test controller 104 executes the in-circuit tests generated by test generator 102. A driver module 114 is used to apply the test signals to a DUT 116, and a sensor (receiver) module 118 is used to receive the response of DUT 116 to the test signals. The combination of driver module 114 and sensor module 118 is known as a tester channel. The HP83000 Integrated Circuit tester is an example of an ATE system, and is available from Hewlett-Packard Company.

Figure 2:
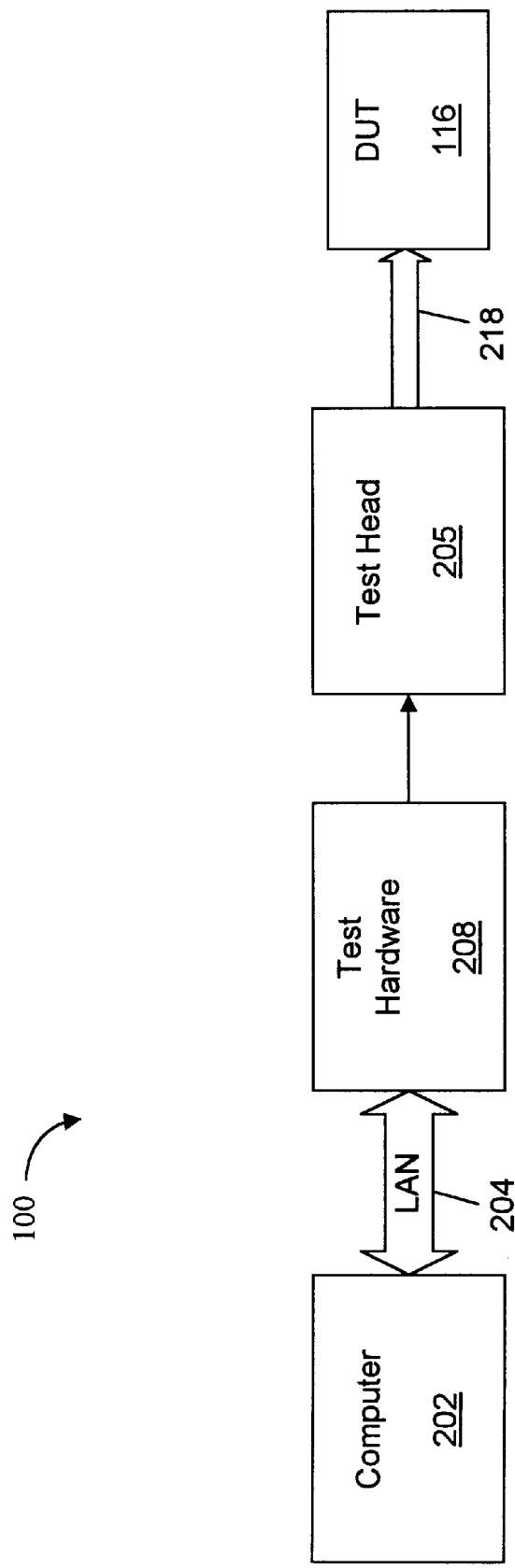
FIG. 2 is a block diagram illustrating an automated testing device.

Reference is now made to FIG. 2, which illustrates an environment in which the tester 100 may operate. A host computer 202 running an application program may be coupled to test hardware 208. In one embodiment, host computer 202 may be coupled to the test hardware 208 via a Local Area Network (LAN) 204. The test hardware 208 typically includes a test head 205 which provides the interface input and output to a DUT 116. The test hardware 208 may include devices, such as drivers and receivers, which can be used to perform testing on the DUT 116. An application program in the host computer 202 may communicate with an interpreter which performs Dynamic Link Library (DLL) calls which instruct remote test head 205 to perform a particular function. The test hardware 208 may receive instructions from the host computer 202. These instructions may then control the various tests that are run on DUT 116.

Figure 3:
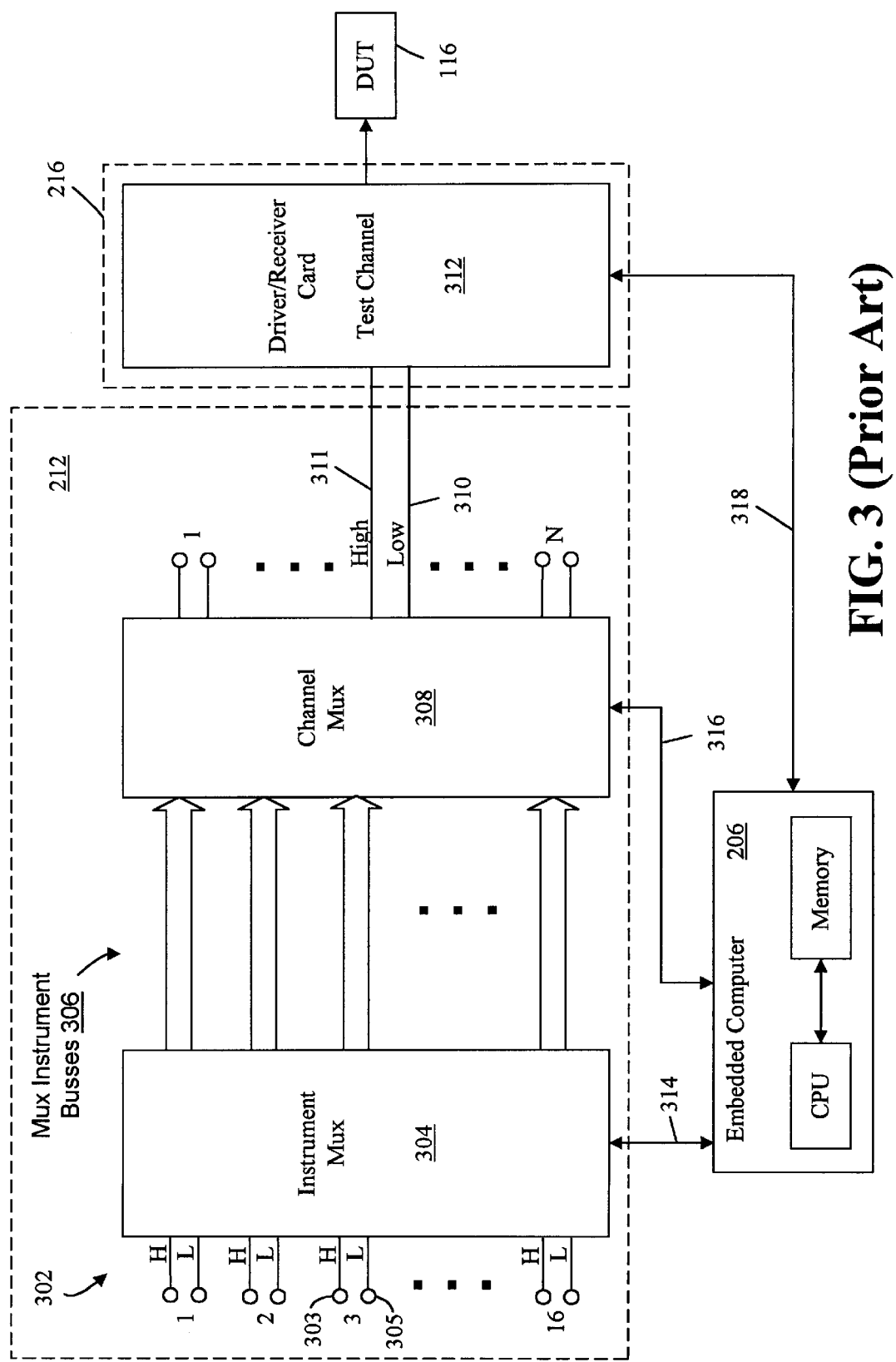
FIG. 3 is a more detailed view of a test head of an automated testing device.

FIG. 3 illustrates the test hardware 208 in greater detail. In one embodiment, sixteen instrument ports, 302, each comprising a high line 303 and a low line 305, are input into an instrument MUX 304. The instrument MUX 304 outputs signals on four instrument buses 306. The embedded computer 206 instructs the instrument MUX 304 via control line 314 as to which instrument signals should be placed on the instrument buses 306. Instrument buses 306 are then multiplexed to a plurality of channels via channel MUX 308.

The embedded computer 206 controls which signals are output from channel MUX 308 via control line 316. The channel MUX 308 outputs comprise DUT high lines 311 and DUT low lines 310. These high and low lines are generated by an instrument 308. The high and low lines are used as inputs into the test channel 312, which is shown in greater detail in FIG. 4, during testing. When testing a particular circuit board, that is a DUT, the number of channels utilized by the embedded computer 206 is generally equal to the number of nodes to be tested on the circuit board.

Figure 4:
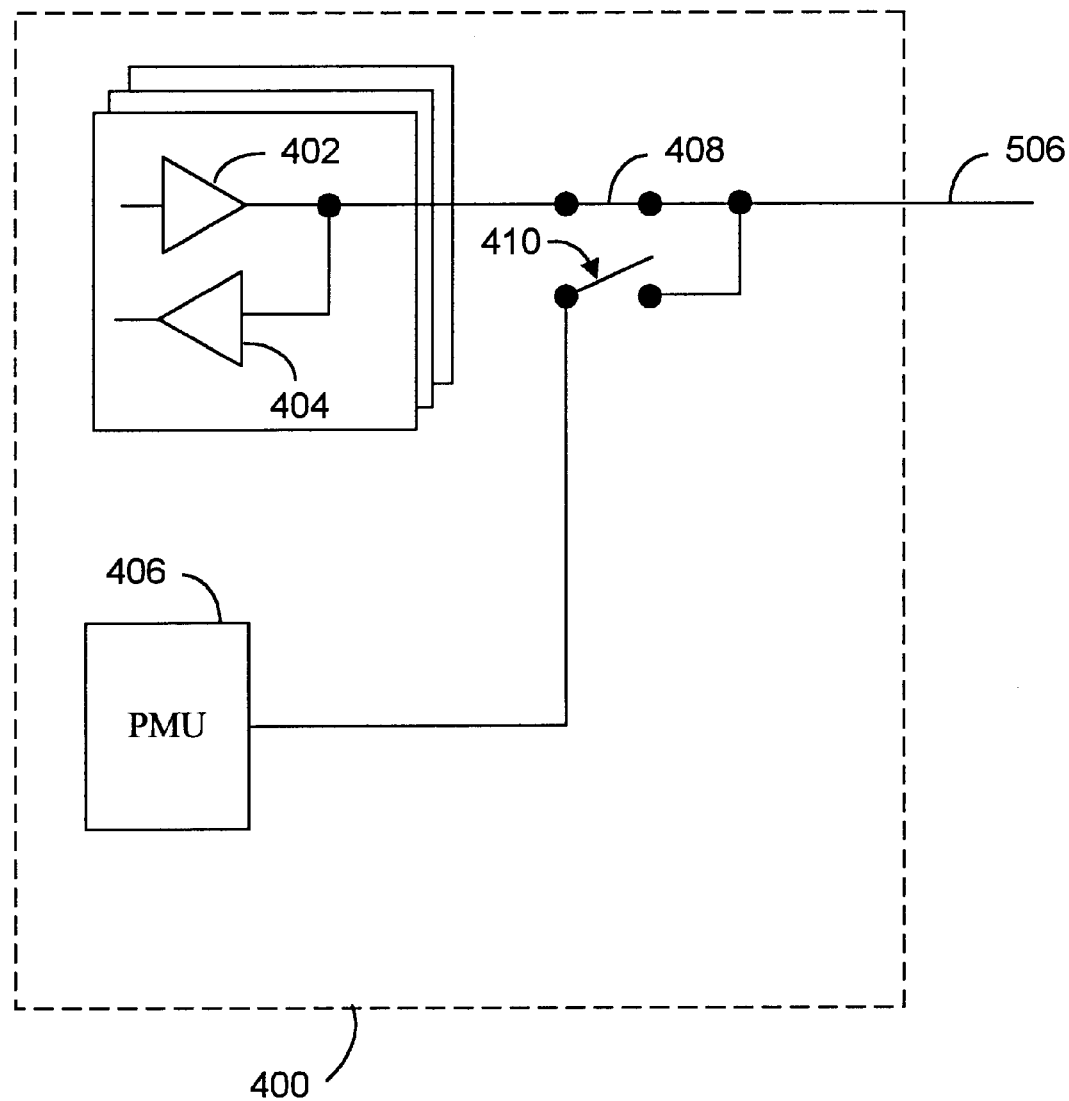
FIG. 4 is a block diagram illustrating principal components of a circuit board containing a plurality of drivers and receivers in a testing device.

Having described, generally, the architecture and environment that is common to many testers, reference is now made to FIG. 4, which is a block diagram of certain components of a circuit board 400 of an HP83000 tester, which is the preferred platform tester for the preferred embodiment of the present invention was designed. As illustrated, the circuit board 400 includes a plurality of drivers 402 and receivers 404. As is known, the drivers 402 are configured to output signals to pins of a test connector. On the HP83000, there are sixteen drivers and sixteen receivers on a single board/channel. A single parametric measurement unit PMU 406, however, is provided on the board 400. As is known, the PMU 406 is configured to quantify or measure signals. In operation, the PMU 406 provides calibration for the drivers 402 and receivers 404.

A number of relays are also illustrated in the drawing, and together provide for a dynamic board configuration. Specifically, a relay 408 selectively connects and disconnects the drivers 402 and receivers 404 from continuity with the test connector. Another relay 410 establishes selective connection with the test connector and another path on the board 400; for example, with the PMU. It will further be appreciated that portions of the present invention control the relay control signals so as to dynamically configure the board 400 in the appropriate manner for carrying out the diagnostic functions of the present invention. Furthermore, although only one of each relay is illustrated in the drawing, it will be appreciated that there may be multiple relays. For example, there is a relay 408 for each of the sixteen driver/receiver 402/404 pairs.

In normal operation, the test connector is connected via cabling or otherwise to a device under test (DUT). Thus, signals generated by the drivers 402 ultimately drive inputs of components on a DUT board. Likewise, output signals from components on a DUT board are delivered via the test connector to the receivers 404. By controllably varying the output level of the drivers 402 and monitoring the input levels of receivers 404, functional operation of a DUT may be tested. In additional to verifying the functional operation of a DUT, testers may also verify whether the components on the DUT are operating in accordance with specified tolerance values or ranges. As previously described, however, this type of testing can produce false or inaccurate results if the components on the tester fail or otherwise go out of specified tolerance.

As previously discussed, there is a known method for measuring level accuracy, which involves the use of external measurement equipment, such as a voltmeter, to collect accuracy data. While this method achieves a relatively high degree of accuracy, it requires a user to manually probe each tester channel for several different measurement sets. In high-volume manufacturing environments, this external measurement device method is unacceptable.

Accordingly, the present invention is provided for testing and determining whether certain tester components are out of tolerance. In accordance with the present invention, the tester is used to measure its own accuracy, and requires a much simpler DUT board and very little user interaction to take data. As will be appreciated, this method is a much better choice because it minimizes impact on the manufacturing environment and still provides adequate measurement accuracy.

Figure 5:
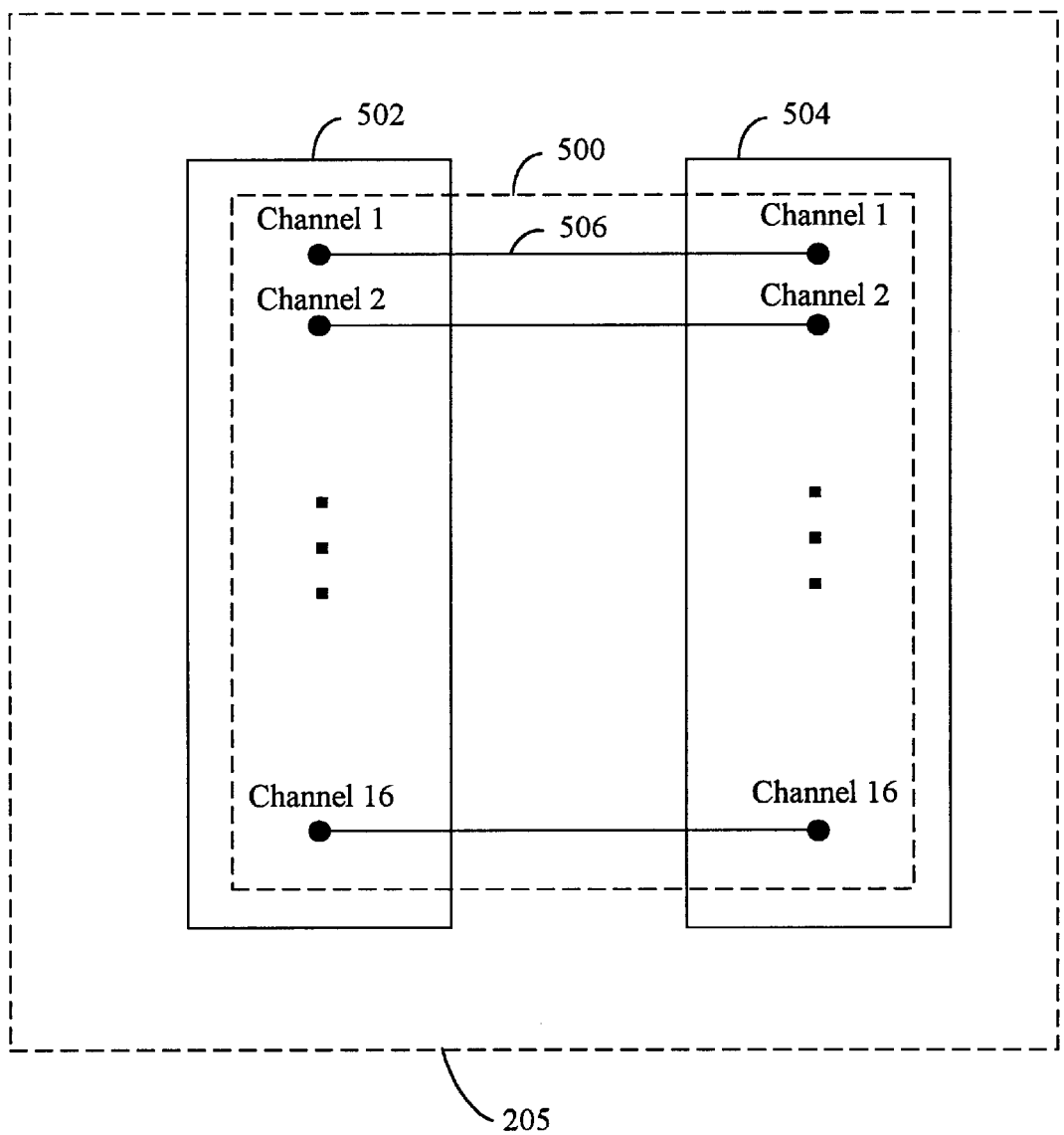
FIG. 5 is a block diagram illustrating the interconnection between pins of two test connectors of the test head of the testing device.

Referring briefly to FIG. 5, a specially-configured DUT board 500 is used in connection with the self tests performed by the preferred embodiment of the present invention. Specifically, this specialized DUT board 500 shorts pins from test connectors 502 and 504 together. As previously described, the tester includes a test head 205, through which all electrical connections with the tester are established. The test head 205 includes a plurality of connectors, such as test connectors 502 and 504. Channels 01 through 16 are illustrated on each of these test connectors 502 and 504. Channel 01 corresponds to a first driver/receiver 402/404 pair on the circuit board 400. The specially-configured DUT board 500 of the preferred embodiment contains conductive paths (e.g., 506) that short channel lines together between adjacent test connectors 502 and 504. In this way, a driver from a first circuit card 400 (for example, a card corresponding to test connector 502) may be connected to a receiver of a second circuit card (for example, a card corresponding to test connector 504). Of course, the preferred embodiment will control the relay control signals on the respective circuit boards 400 so as to effect the appropriate signal paths to establish this connection. In the preferred embodiment, all conductive paths (e.g., 506) on the DUT board 500 will be the same length.

The metrology control tool of the preferred embodiment measures drive and receive voltage level accuracy. The preferred method for using a tester to measure its own drive level accuracy is to program a specified drive level for all channels. The actual drive level provided by each channel is then measured with the tester's onboard voltage measuring device (i.e., the PMU 406). The difference between the programmed level and the measured level is the drive level error. This test is preferably implemented on the tester by configuring half of the tester channels as inputs and the other half as outputs. The DUT board 500 is the interface between inputs and outputs. The inputs are programmed to drive a level, and a Digital Voltage Measurement (DVM) test function, which uses the PMU 406 of the board 400 as a voltmeter, measures the actual levels. To measure drive level errors for the second half of tester channels, channel configurations are swapped and the test is repeated.

Figure 6A:
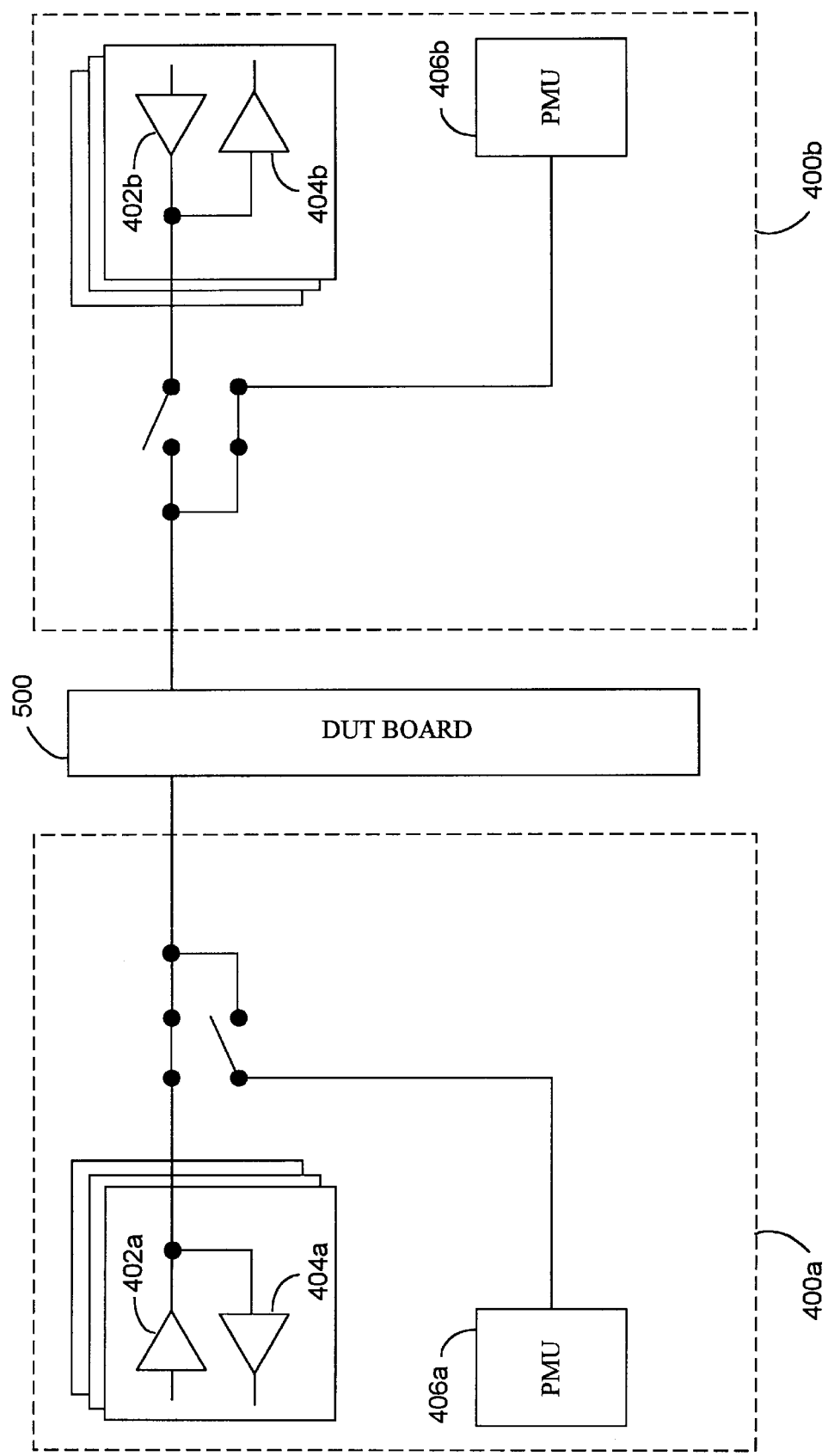
FIG. 6A is a block diagram illustrating the configuration of two circuit boards of the type illustrated in FIG. 4, configured to test and measure driver error.

More particularly, FIG. 6A illustrates the board configurations of two circuit boards 400*a* and 400*b*. As shown, the various relays are configured to connect the drivers 402*a* of board 400*a* to the PMU 406*b* of board 400*b*. As previously mentioned, since the PMU 400*a* is used to calibrate the drivers 402*a* on that same board 400*a*, it is significant that the present invention tests the tester by verifying signal levels from drivers 402*a* with the PMU 406*b* of another board.

Accordingly, the circuit configuration of FIG. 6A is used to verify the accuracy of driver components. In this regard, a driver 402*a* is controlled to output a predetermined "target" value. The actual value received and measured by the PMU 406*b* determines whether the driver 402*a* is out of specification. For example, and using hypothetical values, a control signal may be applied to the driver 402*a* to drive it at a target level of 6500 mV. If the PMU 406*b* receives and measures an actual value of 6300 mV, then it is determined that the driver 402*a* is 200 mV off. If the ATE specifications for the driver require the output to be at least 6400 mV, then the driver 402 would be determined to be 100 mV out of specification.

In accordance with the preferred embodiment, the drivers 402*a* of one board may individually (one at a time) drive the PMU 402*b* of another board. Then the relays 408, 410 may be flipped so that the drivers 402*b* of the second board may be connected to the PMU 406*a* of the first board, and tested. In this way, all drivers from both boards may be tested. This driver verification step is performed to ensure the accuracy of the drivers, before testing the accuracy of the receivers, as described below.

Measuring the accuracy of receiver implicates a more complex test, because testers are not configured to directly measure their own receive levels. To measure receive level accuracy on the tester of the preferred embodiment, half of the tester channels are configured as inputs and the other half are configured as outputs. The DUT board 500 is used as the interface between inputs and outputs. Inputs are programmed to drive a level, and receive levels are varied around that drive level. In this regard, the receiver 404 comprises a comparator. Rather than generate an output "value", the comparator output is effectively binary (indicating that the comparator input—or received value—is either above or below a reference value). The reference value, which is provided on the reference input to the comparator, may be varied until the comparator output changes state, at which point the value of the reference input substantially equals the value of the received input. For example, suppose the receiver is being tested at a known driver voltage of 500 mV. The comparator reference voltage may be controllably varied between 450 mV and 550 mV. While the reference voltage is less than that of the driven/received voltage, the output of the comparator may be in a first state (e.g., zero). Once, however the reference voltage exceeds the driven/received voltage, the output of the comparator may be driven to a second state (e.g., saturation, or logic one). When this state change is sensed, then the reference voltage substantially equals the received voltage.

In the foregoing manner, the receiver 404 may be said to "interpret" the value of the received signal.

For each receive level setting, a functional test is executed. Receive level errors are calculated for each channel by taking the difference between the actual drive level and the receive level (interpreted) at which the functional test stopped (or started, depending on the test) passing. To measure receive level errors for the second half of tester channels, channel configurations are swapped and the test is repeated.

Figure 6B:
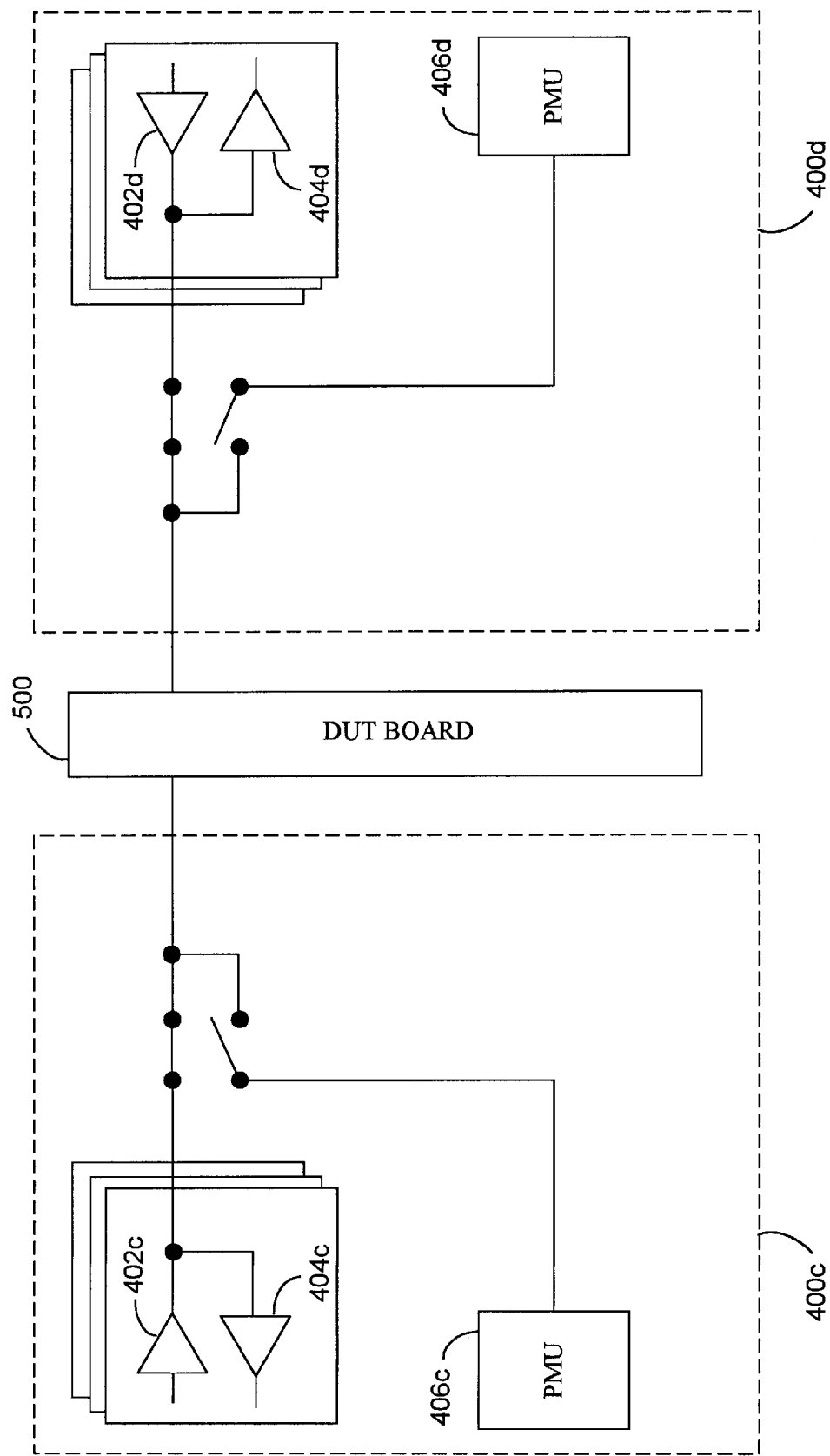
FIG. 6B is a block diagram illustrating the configuration of two circuit boards of the type illustrated in FIG. 4, configured to test and measure receiver error.

Reference is now made to FIG. 6B, the relay/board configurations of two circuit boards 400*a* and 400*b*, configured to test receiver accuracy, are illustrated. Specifically, the relays are configured to connect the drivers 402*c* with the receivers 404*d*. Initiating this test presumes that the drivers 402*c* have been previously tested for accuracy, either by the driver test described above, or by using external test equipment to verify the accuracy of the drive levels of drivers 402*c*. Thereafter, the drivers 402*c* are configured to output a signal at a predetermined drive level. The receiver 404*d* is then evaluated to whether the value received and output therefrom is within specified tolerance of the driven signal.

Preferably, the drive and receive level accuracy tests described above are checked at levels of 500 mV and 6,500 mV, as these levels represent the worst-case settings for the preferred tester, which still fall within HP83000 levels specifications. The same measurements are taken at 500 mV and 6500 mV for both low and high levels in order to track possible differences between driving and receiving a level as a "high" and a "low." In addition, output swing (discussed below) is set to 500 mV for all measurements.

To investigate the robustness and usefulness of the above-described metrology control tool, and to learn more about the driver/receiver performance of the HP83000, several experiments were setup which exercised and challenged the HP83000 levels specifications. First, the DUT board 500, described above, was examined to determine if there were any design or manufacturing anomalies significant enough to impact drive and receive level accuracy measurements. The experiment involved taking drive level error measurements, then removing the DUT board 500 and performing the same measurements again. The measurements performed without the DUT board used the PMUs 406 on the circuit board 400 as the channels whose drive levels were being measured to measure drive levels. Results showed less than a 1 mV difference between the two measurement methods, so the DUT board was considered suitable.

Settling time and its effects on drive level accuracy when measured with the method described above were also investigated. For settling times of 0 ms to 500 ms, drive levels were varied and measured. Results showed less than a 1 mV difference between measured drive levels for 0 ms and 500 ms settling times. Therefore, settling time was determined not to be a factor in the chosen method for measuring drive level accuracy.

Because of its possible impact on receive level accuracy measurements, drive level repeatability was studied. Five sets of drive level measurements were taken within a five minute period (the estimated time needed to perform drive and receive level accuracy measurements in the final production version of the tool). Results showed drive levels to be repeatable within 1 mV, which is insignificant when compared to the expected receive level errors of +/−25 mV and +/−50 mV.

The HP83000 "Output Swing" specification was studied in order to verify the specification and understand its effects on the drive level accuracy measurement method. "Output swing" is defined as the distance between the low level setting and the high level setting. The HP83000 output swing specification is 500 mV to 6000 mV. This means that for all other driver specifications to be guaranteed, the difference between low and high drive level settings should be no less than 500 mV and no greater than 6000 mV. It should be noted, however, that output swing can be programmed between 100 mV and 7000 mV. The experiment was to vary the output swing from 100 mV to 6500 mV and measure drive level errors for each output swing setting. Results showed drive level errors to be minimized when the output swing was 500 mV or greater, which confirmed the HP83000 specification. Output swings of greater than 6000 mV appeared to have no effect on drive level accuracy.

Since the lowest drive level measured by the levels metrology control tool is 500 mV, an experiment was performed to check accuracy for drive levels less than 500 mV. Drive levels were programmed from 500 mV down to −1500 mV and their errors measured. Results showed that errors for 500 mV drive levels were within 1 to 2 mV of errors for drive levels less than 500 mV.

Another experiment investigated how the drive/receive 402/404 circuitry located on the measurement side of the drive level accuracy circuit affected drive level errors. To isolate the unnecessary drive/receive 402/404 circuitry, the AC relay 408 (See FIG. 4) on the measurement side of the circuit was opened and drive level errors were measured. This data was compared to drive level errors measured with the AC relay closed, which is the default position for the relay during the DVM test function. Results showed that the drive/receive circuitry located on the measurement side of the drive level accuracy circuit contributed an extra 5–10 mV of error for drive levels programmed to 6500 mV. This is significant given the expected error of +/−50 mV for a 6500 mV drive level. Even though the drive level accuracy measurement method described above will work for both relay positions, opening the relay 408 on the measurement side of the circuit provides better accuracy. The final version of the levels metrology control tool takes drive level error data with the relay 408 open.

Figure 7:
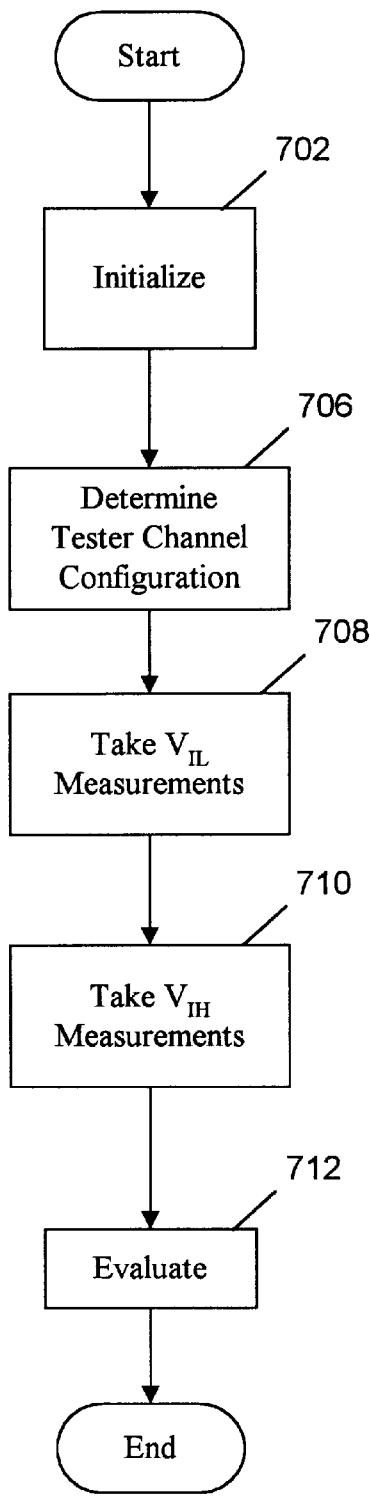
FIG. 7 is an operational flowchart illustrating the principal steps in testing and measuring driver error.

Reference is now made briefly to FIG. 7, which shows an operational flowchart of the principal steps involved in the method of verifying the driver operation. Specifically, upon start-up the method performs an initialization routine 702, which includes initializing variables and performing a variety of initial configuration tasks, which will necessarily vary from tester to tester and implementation to implementation, and therefore need not be discussed herein. After initialization, the method determines and configures the various tester channels for performing the driver test (step 706). It then performs the test for $V_{IL}$, (step 708). The method then performs the test for $V_{IH}$, (step 710).

Finally, at step 712 the method evaluates the results to determine whether the drivers 402 are within a specified tolerance or not. It will be appreciated, however, that in connection with this test, various corrective action measures may be taken. For example, it may notify appropriate personnel of the failed results, by email (if the tester is connected to a LAN) or otherwise, so that appropriate personnel can perform corrective actions.

Figure 8:
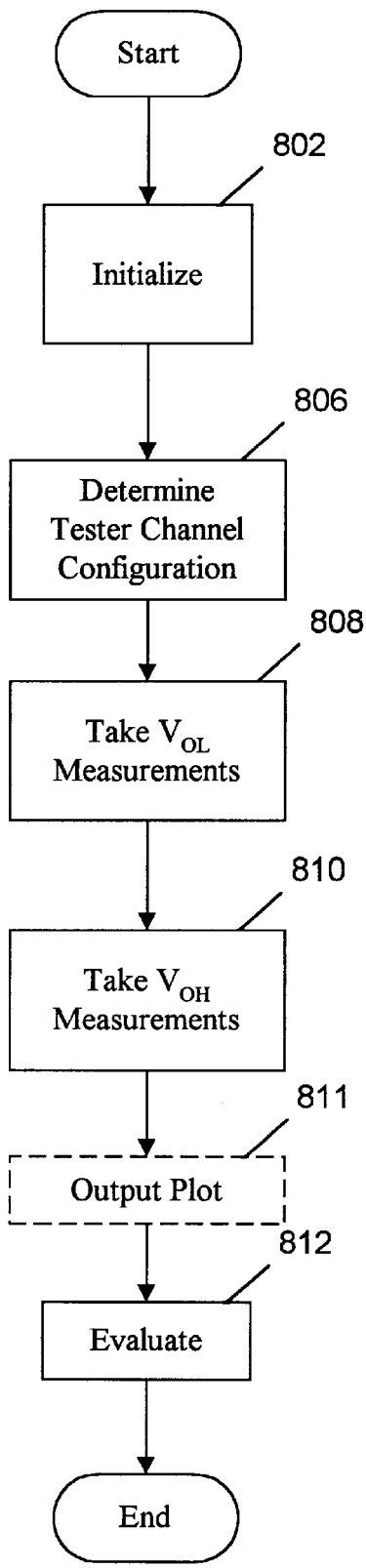
FIG. 8 is an operational flowchart illustrating the principal steps in testing and measuring receiver error.

Reference is now made briefly to FIG. 8, which shows an operational flowchart of the principal steps involved in the method of verifying the receiver operation. Specifically, upon start-up the method may perform an initialization routine 802, which includes initializing variables and performing a variety of initial configuration tasks, which will necessarily vary from tester to tester and implementation to implementation, and therefore need not be discussed herein. It will be appreciated, however, that this step may be skipped if initialization has already been performed, as by step 702 (FIG. 7). After initialization, the method determines and configures the various tester channels for performing the receiver test (step 806). It then performs the test for $V_{OL}$ (step 808). The method then performs the test for $V_{OH}$ (step 810).

In the preferred embodiment, a routine is provided to generate a graphical output illustrating this test results (Step 811). Finally, at step 812 the method evaluates the results to determine whether the receivers 404 are within a specified tolerance or not. It will be appreciated that, in connection with this test, the various corrective action measures mentioned in connection with FIG. 7 may be taken here as well.

The foregoing description has been presented for purposes of illustration and description. It is not intended to be exhaustive or to limit the invention to the precise forms disclosed. Obvious modifications or variations are possible in light of the above teachings. The embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A system for testing component tolerance of a device for testing integrated circuits, the device having a plurality of test connectors disposed at a test head, each test connector having electrical conductors carrying electrical signals for a test channel, wherein each test channel corresponds to a circuit board that includes at least one driver and one receiver, the system comprising:

shorting means for establishing a low impedance electrical connection between electrical conductors of a first and second test connector, such that a first driver from a first circuit board is electrically connected across a low impedance path to a measurement unit on a second circuit board;

a controller configured to control the first driver to output an electrical signal of a predetermined target value; and verifying means configured to verify that the voltage level received by the measurement unit is within a predetermined amount of the predetermined target value.

2. A system for testing component tolerance of a device for testing integrated circuits, the device having a plurality of test connectors disposed at a test head, each test connector having electrical conductors carrying electrical signals for a test channel, wherein each test channel corresponds to a circuit board that includes at least one driver and one receiver, the system comprising:

shorting means for establishing a low impedance electrical connection between electrical conductors of a first and second test connector, such that a first driver from a first circuit board is electrically connected across a low impedance path to a first receiver on a second circuit board;

a controller configured to control the first driver to output an electrical signal of a predetermined value;

evaluating means designed to interpret the signal voltage level delivered to the first receiver; and verifying means configured to verify that the interpreted signal is within a specified amount of the predetermined value.

3. The apparatus as defined in claim 2, wherein the shorting means includes a printed circuit board containing metal layers that establish direct conductive paths between pins on the first test connector to pins on the second test connector.

4. The apparatus as defined in claim 2, wherein the evaluating means and the verifying means are realized through program code that controls the operation of a processing unit.

5. The apparatus as defined in claim 2, wherein the processing unit is a device selected from the group consisting of: a microprocessor, a microcontroller, an embedded controller, an application specific integrated circuit, and dedicated hardware specially designed to carry-out processing and control functions.

6. In a testing device for testing integrated circuits having a plurality of test connectors disposed at a test head, each test connector having electrical conductors carrying electrical signals for a test channel, wherein each test channel corresponds to a circuit board that includes at least one driver, a method for diagnosing component variances comprising the steps of:

establishing an electrical connection between electrical conductors of a first and second test connector such that a first driver from a first circuit board is electrically connected across a low impedance path to a measurement unit on a second circuit board, controlling the output of the first driver to drive an electrical signal to a predetermined target value;

verifying that the signal received and measured by the measurement unit is within a specified amount of the predetermined value.

7. The method as defined in claim 6, further including the steps of:

establishing an electrical connection between electrical conductors of a first and second test connector such that a second driver from a second circuit board is electrically connected across a low impedance path to a measurement unit on a first circuit board;

controlling the output of the second driver to drive an electrical signal to a predetermined target value;

verifying that the signal received and measured by the measurement unit is within a specified amount of the predetermined value.

8. In a testing device for testing integrated circuits having a plurality of test connectors disposed at a test head, each test connector having electrical conductors carrying electrical signals for a test channel, wherein each test channel corresponds to a circuit board that includes at least one driver and one receiver, a method for diagnosing component variances comprising the steps of:

establishing an electrical connection between electrical conductors of a first and second test connector such that a first driver from a first circuit board is electrically connected across a low impedance path to a first receiver on a second circuit board, wherein the first driver is known to be within a specified tolerance;

controlling the output of the first driver to drive an electrical signal to a predetermined value;

evaluating the signal level interpreted at the first receiver; and verifying that the interpreted signal is within a specified amount of the predetermined value.

9. The method as defined in claim 8, further including the steps of:

establishing an electrical connection between electrical conductors of a first and second test connector such that a second driver from the first circuit board is electrically connected across a low impedance path to a second receiver on a second circuit board, wherein the second driver is known to be within a specified tolerance;

controlling the output of the second driver to drive an electrical signal to a predetermined value;

evaluating the signal level interpreted at the second receiver; and verifying that the signal level interpreted at the second receiver is within a specified amount of the predetermined value output from the second driver.

10. The method as defined in claim 8, wherein the step of establishing an electrical connection further comprises establishing an electrical connection between electrical conductors of a first and second test connector such that a plurality of drivers from a first circuit board are electrically connected across low impedance paths to a plurality of receivers on a second circuit board, and a plurality of drivers from a second circuit board are electrically connected across low impedance paths to a plurality of receivers on a first circuit board, wherein each of the plurality of drivers is known to be within a specified tolerance.

11. The method as defined in claim 8, wherein the step of controlling the output of the first driver includes the step of controlling the output of the first driver to a first level that represents a specified low margin for an output high signal, wherein the verifying step will ensure that the value received by the first receiver is at least this value.

12. The method as defined in claim 8, wherein the step of controlling the output of the first driver includes the step of controlling the output of the first driver to a first level that represents a specified high margin for an output high signal, wherein the verifying step will ensure that the value received by the first receiver is no greater than this value.

13. The method as defined in claim 8, wherein the step of controlling the output of the first driver includes the step of controlling the output of the first driver to a first level that represents a specified low margin for an output low signal, wherein the verifying step will ensure that the value received by the first receiver is at least this value.

14. The method as defined in claim 8, wherein the step of controlling the output of the first driver includes the step of controlling the output of the first driver to a first level that represents a specified high margin for an output low signal, wherein the verifying step will ensure that the value received by the first receiver is no greater than this value.

15. In a testing device for testing integrated circuits having a plurality of test connectors disposed at a test head, each test connector having electrical conductors carrying electrical signals for a test channel, wherein each test channel corresponds to a circuit board that includes at least one driver and one receiver, a method for diagnosing component variances comprising the steps of:

establishing an electrical connection between electrical conductors of a first and second test connector such that at a first driver from a first circuit board is electrically connected across a low impedance path to a first receiver on a second circuit board, wherein the first driver is known to be within a specified tolerance;

delivering a control signal to the first driver to drive its output signal to a target value;

evaluating the signal level interpreted at the first receiver; and verifying that the signal level received at the first receiver is within a specified amount of the predetermined signal level output from the first driver.

16. The method as defined in claim 15, further including the steps of:

establishing an electrical connection between electrical conductors of a first and second test connector such that a second driver from a second circuit board is electrically connected across a low impedance path to a second receiver on a first circuit board, wherein the second driver is known to be within a specified tolerance;

delivering a control signal to the second driver to drive its output signal to a target value;

evaluating the signal level interpreted at the second receiver; and verifying that the signal level interpreted at the second receiver is within a predetermined tolerance of the predetermined signal level output from the first driver.

17. The method as defined in claim 15, wherein the step of establishing an electrical connection further comprises establishing an electrical connection between electrical conductors of a first and second test connector such that a plurality of drivers from a first circuit board are electrically connected across low impedance paths to a plurality of receivers on a second circuit board, and plurality of drivers from a second circuit board are electrically connected across low impedance paths to a plurality of receivers on a first circuit board, wherein each of the plurality of receivers is known to be within a specified tolerance.

18. A computer readable storage medium containing program code for controlling the operation of a self test for an automatic testing device, comprising:

a first code segment that contains program code that controls the output of a first driver on a first circuit board to drive an electrical signal to a predetermined value;

a second code segment that contains program code that evaluates the signal level interpreted by a first receiver disposed on a second circuit board, that is configured to receive the signal output by the first driver; and a third code segment that contains program code that verifies that the signal level interpreted by the first receiver is within a predetermined tolerance of the predetermined signal level output from the first driver.

19. A computer readable storage medium containing program code for controlling the operation of a self test for an automatic testing device, comprising:

a first code segment that contains program code that controls the output of a first driver on a first circuit board to drive an electrical signal to a predetermined target value;

a second code segment that contains program code that evaluates the signal level received at a measurement unit disposed on a second circuit board, that is configured to receive the signal output by the first driver; and a third code segment that contains program code that verifies that the signal level measured by the measurement unit is within a specified amount of the predetermined signal level output from the first driver.

20. A computer readable storage medium containing program code for controlling the operation of a self test for an automatic testing device, comprising:

a first code segment that contains code that controls the output of a first driver on a first circuit board to drive an electrical signal to a predetermined value and uses a measurement unit on a second circuit board to measure the voltage level actually provided by the first driver a second code segment that contains code that controls the output of a first driver on a first circuit board to drive an electrical signal to a predetermined value and evaluates the signal level interpreted by a first receiver disposed on a second circuit board, that is configured to receive the signal output by the first driver a third code segment that contains program code that verifies 1) that the signal level provided by the first driver is within a specified amount and 2) that, considering predetermined error of the first driver, the voltage level interpreted by the first receiver is within a specified amount.

* * * * *